(12) United States Patent
Singh et al.

(10) Patent No.: US 10,147,639 B2
(45) Date of Patent: Dec. 4, 2018

(54) VIA SELF ALIGNMENT AND SHORTING IMPROVEMENT WITH AIRGAP INTEGRATION CAPACITANCE BENEFIT

(71) Applicant: Intel Corporation, Santa Clara, CA (US)

(72) Inventors: Kanwal Jit Singh, Hillsboro, OR (US); Alan M. Myers, Beaverton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/523,330

(22) PCT Filed: Dec. 22, 2014

(86) PCT No.: PCT/US2014/071909
§ 371 (c)(1),
(2) Date: Apr. 28, 2017

(87) PCT Pub. No.: WO2016/105344
PCT Pub. Date: Jun. 30, 2016

(65) Prior Publication Data
US 2017/0250104 A1    Aug. 31, 2017

(51) Int. Cl.
*H01L 21/00* (2006.01)
*H01L 23/00* (2006.01)
(Continued)

(52) U.S. Cl.
CPC ........ *H01L 21/7682* (2013.01); *H01L 21/764* (2013.01); *H01L 21/76834* (2013.01);
(Continued)

(58) Field of Classification Search
CPC ........... H01L 21/7682; H01L 21/76897; H01L 21/76831; H01L 23/5226; H01L 23/5329; H01L 23/53228; H01L 2224/16225
See application file for complete search history.

(56) References Cited

U.S. PATENT DOCUMENTS 6,413,852 B1 * 7/2002 Grill .................... H01L 21/7682
257/E21.576
7,534,696 B2 * 5/2009 Jahnes ................. H01L 21/7682
257/E21.573
(Continued)

OTHER PUBLICATIONS

Intel Corporation, "International search report and written opinion", PCT Application No. PCT/US2014/071909, (dated Sep. 22, 2015).

*Primary Examiner* — Nikolay Yushin
(74) *Attorney, Agent, or Firm* — Schwabe, Williamson & Wyatt, P.C.

(57) ABSTRACT

A method including forming a sacrificial material between metal lines of an integrated circuit structure; forming a mask on the sacrificial material; and after forming the mask, removing the sacrificial material to leave a void between the metal lines. An apparatus including an integrated circuit substrate; a first metallization level on the substrate; a second metallization; and a mask disposed between the first metallization level and the second metallization level, the mask including a dielectric material having a porosity select to allow mass transport therethrough, wherein each of the first metallization level and the second metallization level comprises a plurality of metal lines and a portion of adjacent metal lines of at least one of the first metallization level and the second metallization level are separated by voids.

17 Claims, 5 Drawing Sheets

(51) Int. Cl.
    *H01L 21/768*     (2006.01)
    *H01L 29/78*     (2006.01)
    *H01L 21/84*     (2006.01)
    *H01L 21/764*     (2006.01)
    *H01L 23/522*     (2006.01)
    *H01L 23/532*     (2006.01)

(52) U.S. Cl.
    CPC ........ *H01L 21/76897* (2013.01); *H01L 21/84* (2013.01); *H01L 23/5226* (2013.01); *H01L 23/5329* (2013.01); *H01L 23/53228* (2013.01); *H01L 29/78* (2013.01); *H01L 2224/16225* (2013.01)

(56) References Cited

U.S. PATENT DOCUMENTS

| | | | |
|---|---|---|---|
| 7,541,277 B1 * | 6/2009 | Petrarca | H01L 21/7682 |
| | | | 438/618 |
| 8,080,475 B2 * | 12/2011 | RamachandraRao | ........ |
| | | | H01L 21/02068 |
| | | | 257/E21.219 |
| 2003/0127740 A1 | 7/2003 | Hsu et al. | |
| 2003/0168747 A1 | 9/2003 | Hussein et al. | |
| 2004/0127001 A1 | 7/2004 | Colburn et al. | |
| 2007/0259516 A1 | 11/2007 | Jahnes et al. | |
| 2011/0278730 A1 | 11/2011 | Naujok et al. | |

\* cited by examiner

VIA SELF ALIGNMENT AND SHORTING IMPROVEMENT WITH AIRGAP INTEGRATION CAPACITANCE BENEFIT

CROSS-REFERENCE TO RELATED APPLICATION

This patent application is a U.S. National Phase Application under 35 U.S.C. § 371 of International Application No. PCT/US2014/071909, filed Dec. 22, 2014, entitled "VIA SELF ALIGNMENT AND SHORTING IMPROVEMENT WITH AIRGAP INTEGRATION CAPACITANCE BENEFIT."

BACKGROUND

Field

Integrated circuit structures.

Description of Related Art

Integrated circuit structures generally include devices such as field effect transistors formed in or on a semiconductor substrate in combination with a multi-level interconnect structure with connections between different ones of the devices. A representative multi-level interconnect structure includes one or more arrays or levels of wiring lines to provide connections to and between devices. Closely spaced, generally parallel wiring lines, can provide undesirable level of capacitive coupling, particularly, for higher data transmission rates through the wiring lines. Such capacitive coupling can slow data transmission rates and increase energy consumption in a manner that can limit the performance of the integrated circuits.

One effort to reduce an undesirable level of capacitive coupling between adjacent wiring lines is modifying the dielectric material that separates the wiring lines. Specifically, efforts have been made to replace dielectric materials that have relatively high dielectric constants with materials having lower dielectric constants. Using air as a dielectric by forming, for example, air gaps between adjacent metal lines is one strategy. However, one issue surrounding the use of air gaps is unlanded vias. When conductive vias are misaligned with respect to wiring lines at, for example, a level below and land in an air gap, such misaligned vias reduce shorting margin or, in the worst case, can short adjacent lines. Undesired metal deposition in the air gap through an unlanded via also impacts interconnect reliability. Accordingly, efforts directed at introducing air gapped layers use masks to prevent formation of air gaps where vias are present. Use of masks, however, limits the implementation of air gaps, particularly, in lower interconnect levels where via density tends to be higher or in areas involving tight pitches.

DETAILED DESCRIPTION

Figure 1:
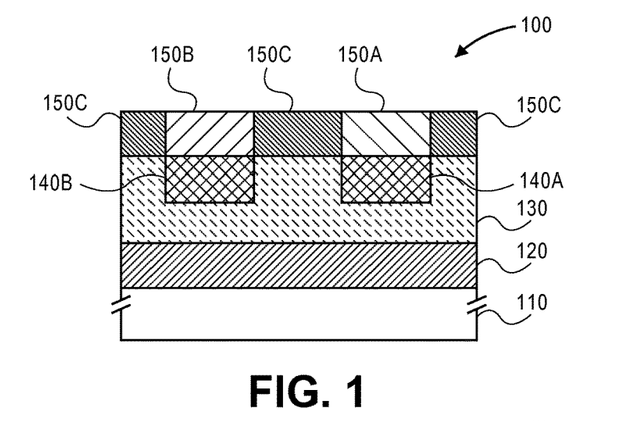
FIG. 1 shows a cross-sectional side view of a portion of an integrated metallization level in a dielectric layer, the metallization level including two metal lines, a first hardmask material on one metal line, a second hardmask material on the other metal line and a third hardmask material between the first and second hardmask materials disposed in the metal lines.

FIG. 1 shows an embodiment of an integrated circuit structure including one or more metallization levels connected to devices (e.g., transistor devices) on a semiconductor substrate. Referring to FIG. 1, structure 100 includes substrate 110 that is, for example, a semiconductor substrate or a semiconductor on insulator (SOI) substrate. Substrate 110, in one embodiment, has a number of devices and circuits formed in/on a device side of substrate 110 (a top side as viewed).

Overlying a device side of substrate 110 in the structure of FIG. 1, in one embodiment, is one or more metallization layers separated from substrate 110 and any adjacent metal layer(s) by dielectric material. In the embodiment shown in FIG. 1, structure 100 includes etch stop layer 120 of, for example, a nitride, oxide, oxynitride, carbide, oxycarbide or other non-conducting material, followed by dielectric layer 130 that is, for example, silicon dioxide or a material having a dielectric constant less than silicon dioxide. Disposed within dielectric layer 130 is a first metallization level including metal line 140A adjacent to metal line 140B. In one embodiment, each of metal line 140A and metal line 140B is a copper material embedded in dielectric layer 130 and formed, for example, by a plating process. As illustrated, the metallization level and dielectric layer 130 collectively define a planar surface. Disposed on a surface of each of metal line 140A and metal layer 140B is a hardmask. FIG. 1 shows hardmask material 150A on metal line 140A and hardmask material 150B on metal layer 140B. In one embodiment, hardmask material 150A is different (e.g., has a different etch rate characteristic) than hardmask material 150B and hardmask material 150C. Hardmask material 150B and hardmask material 150C are also different from one another. Suitable hardmask materials include a nitride, oxide, oxynitride, carbide, oxycarbide or other non-conducting material. As illustrated, hardmask material 150C is on top of dielectric layer 130, hardmask material 150A and hardmask material 150B are present on alternating metal lines. An optional layer (etch stop) may or may not exist on top of hardmask material 150C, hardmask material 150B and hardmask material 150A.

Figure 2:
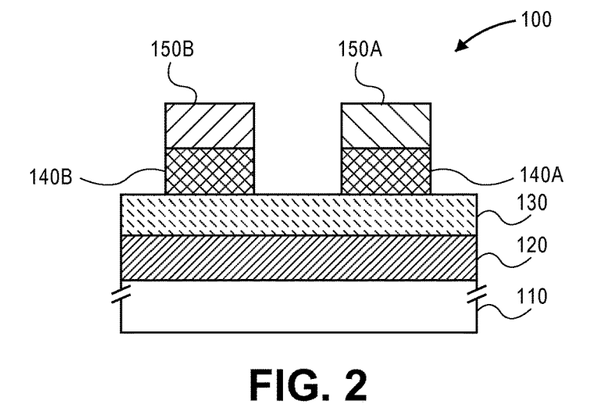
FIG. 2 shows the structure of FIG. 1 following an airgap etch of the third hardmask material and the dielectric layer with selectivity towards (relative to) the first and second hardmask material.

FIG. 2 shows the structure of FIG. 1 following an airgap etch of hardmask material 150C and dielectric layer 130 with selectivity towards (relative to) hardmask material 150B and hardmask material 150A (i.e., the etchant removes hardmask material 150C and a portion of dielectric layer 130 without or with minimal removal of either hardmask material 150A or hardmask material 150B and metal lines 140A and 140B). Suitable material needed with appropriate etch selectivities to allow for this etch have been identified. Although the airgap etch is shown in this embodiment to stop at the base of the metallization level, in another embodiment, airgaps may be etched as deep as needed.

Figure 3:
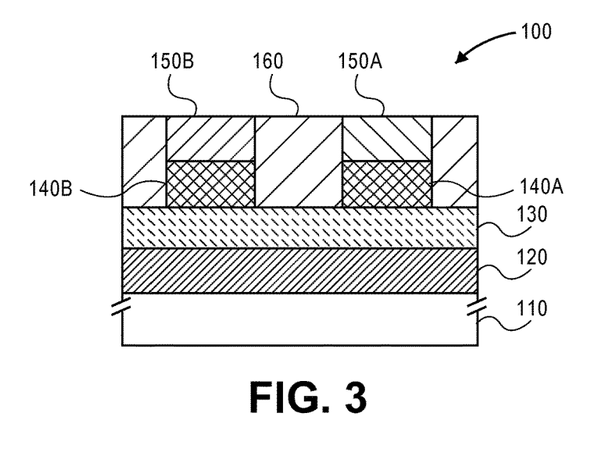
FIG. 3 shows the structure of FIG. 2 following filling of the cavity created by the airgap etch with a sacrificial material and planarizing the sacrificial material to be at a similar level (height) as the second hardmask materials.

FIG. 3 shows the structure of FIG. 2 following filling of the cavity created by the airgap etch with sacrificial material 160 of a dielectric or non-dielectric that is wet or dry etchable by an appropriate chemistry followed by a polish to planarize. In one embodiment, sacrificial material 160 is a low-density oxide that is wet etchable. In another embodiment, sacrificial material 160 could be an organic fillable material that can be dry etched through a porous hardmask. This embodiment is shown as an embodiment using two different dielectrics for the purposes of selectivity (a material of dielectric layer 130 and dielectric material 160). If a material for dielectric layer 130 is wet etchable with an acceptable undercut, removal of hardmask material 150C alone by dry etch is a possible embodiment (not shown). In the embodiment illustrated, using a sacrificial dielectric material allows for control of an airgap cavity by patterning a stable dielectric layer followed by filling with a sacrificial dielectric material.

Figure 4:
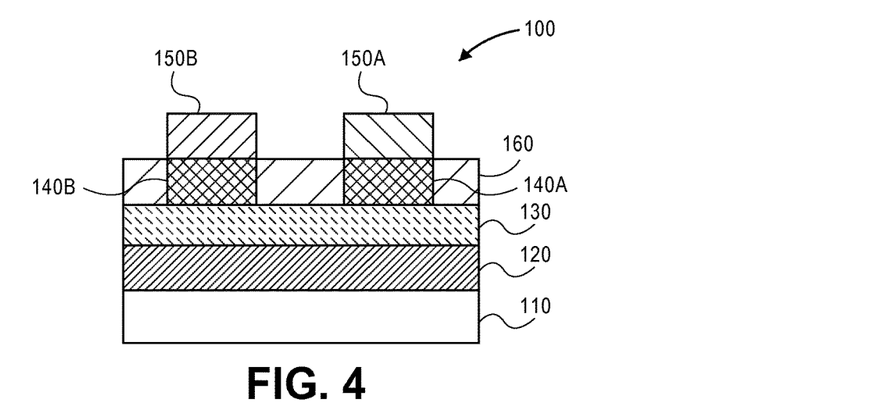
FIG. 4 shows the structure of FIG. 3 following recessing of the sacrificial material to a plane corresponding to a top surface of the metal lines.
Figure 5:
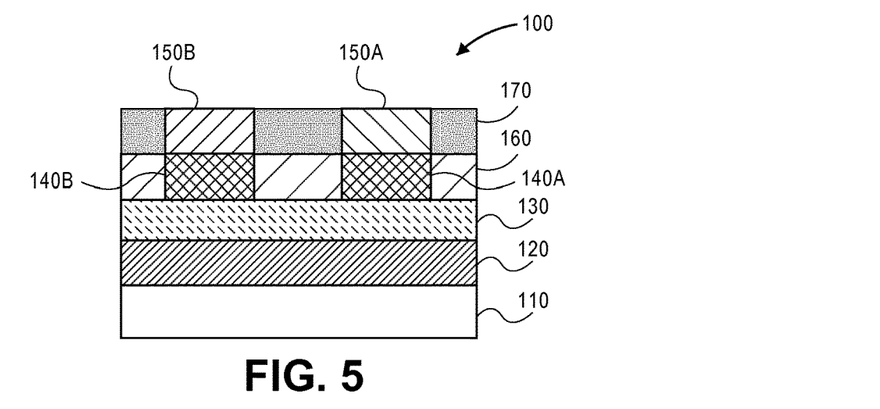
FIG. 5 shows the structure of FIG. 4 following the filling and planarizing of a fourth hardmask material on the sacrificial material.

FIG. 4 shows the structure of FIG. 3 following a recess of sacrificial material 160 to a plane corresponding to a top surface of metal line 140A and metal layer 140B. Sacrificial material 160 may be removed by an etch process FIG. 5 shows the structure of FIG. 4 following the introduction of (forming of) hardmask material 170 on dielectric material 160. In one embodiment, hardmask material 170 is a porous and etch resistant dielectric that is deposited and planarized. The porosity is chosen such that it allows mass transport through the material so that dielectric material 160 underlying the hardmask material can be etched using an appropriate chemistry. In one embodiment, hardmask material 170 also has a similar dry etch selectivity as hardmask material 150C, i.e., is able to withstand subsequent etches of hardmask material 150B and hardmask material 150A. Components research ILD-Churla is an example of a material that has desired hardmask material 170 properties.

Figure 6:
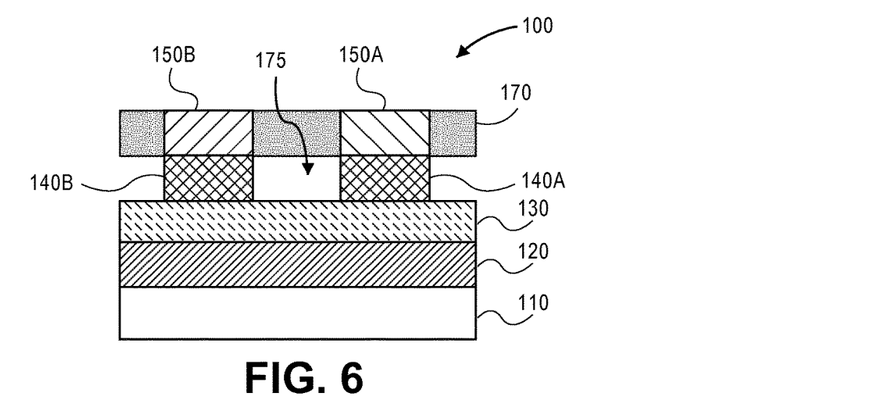
FIG. 6 shows the structure of FIG. 5 following an etch of the sacrificial material through the fourth hardmask material with selectivity towards dielectric layer, metal lines, and hardmask materials.

FIG. 6 shows the structure of FIG. 5 following a wet etch of dielectric material 160 through porous hardmask material 170 to form the airgap cavity 175.

Figure 7:
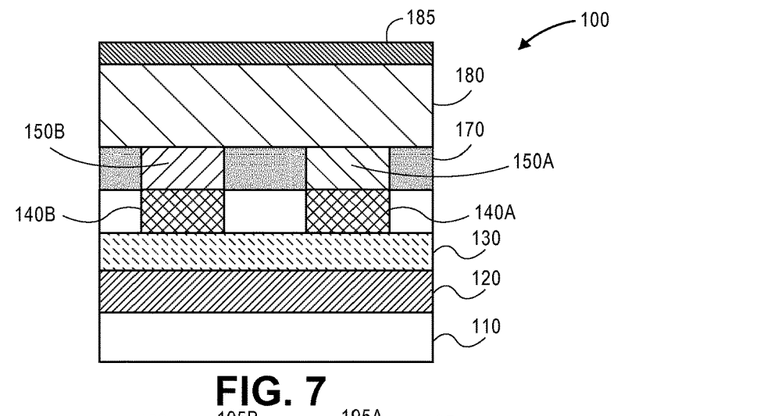
FIG. 7 shows the structure of FIG. 6 following the introduction of a dielectric layer on the first, second and fourth hardmask materials followed by the formation of a hardmask on the dielectric layer.

FIG. 7 shows the structure of FIG. 6 following the introduction of (forming of) dielectric layer 180 on hardmask material 150A, hardmask material 150B and hardmask 170 followed by the formation of hardmask 185 on dielectric layer 180. Dielectric layer 180 is selected to be a suitable interlayer dielectric material. Hardmask material is a suitable material for a damascene process.

Figure 8:
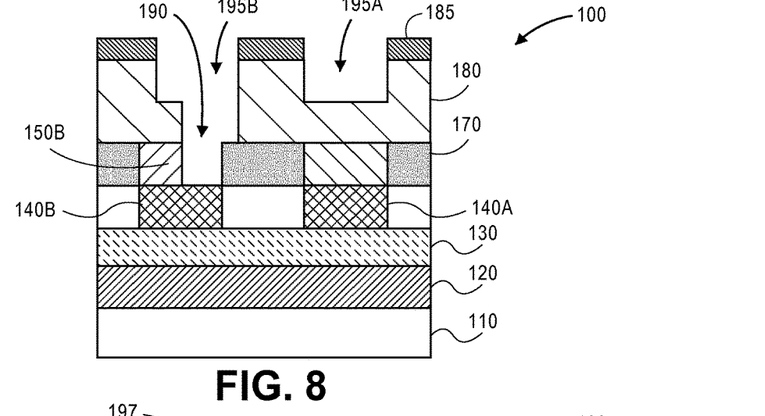
FIG. 8 shows the structure of FIG. 7 following dual damascene patterning to create trenches and a via in one trench through hardmask material and the dielectric layer to an underlying metal layer.

FIG. 8 shows the structure of FIG. 7 following a dual damascene patterning to create trench 195A and trench 195B and via 190 in dielectric layer 180 (trenches) and hardmask 150B (vias) to metal line 140B. As can be seen in FIG. 8, the via etch lands on hardmask material 150B and etches it with selectivity towards hardmask material 170. This would also be true in the case of a via landing on hardmask material 150A and etching it with selectivity towards hardmask material 170 (not shown). In addition, although it is not shown in FIG. 8, if the via was larger than anticipated and landed on hardmask material 150A, the etch of hardmask material 150B is selective to hardmask material 150A and thus prevents shorting of the metal lines 140A and 140B through any such large via after metallization.

Figure 9:
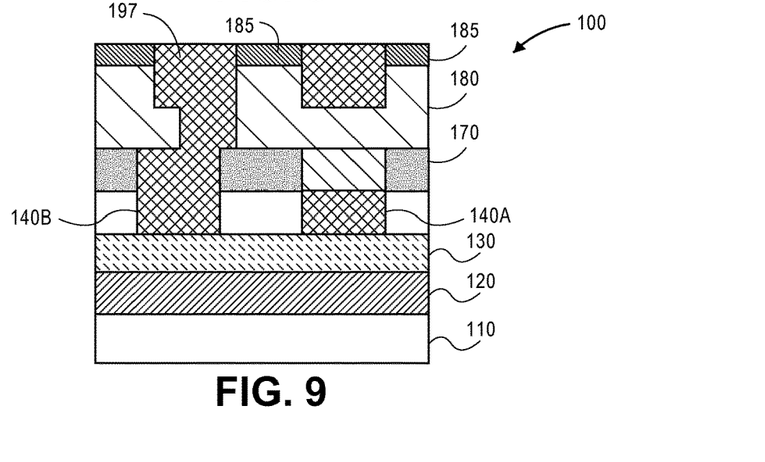
FIG. 9 shows the final airgapped structure after a dual damascene metallization and polish.

FIG. 9 shows the final airgapped structure after a dual damascene metallization and polish. The via is contained by hardmask material 170 and does not punch through to the airgap cavity. Airgaps provide capacitance benefit while hardmask material 170 provides shorting margin improvement.

Figure 10:
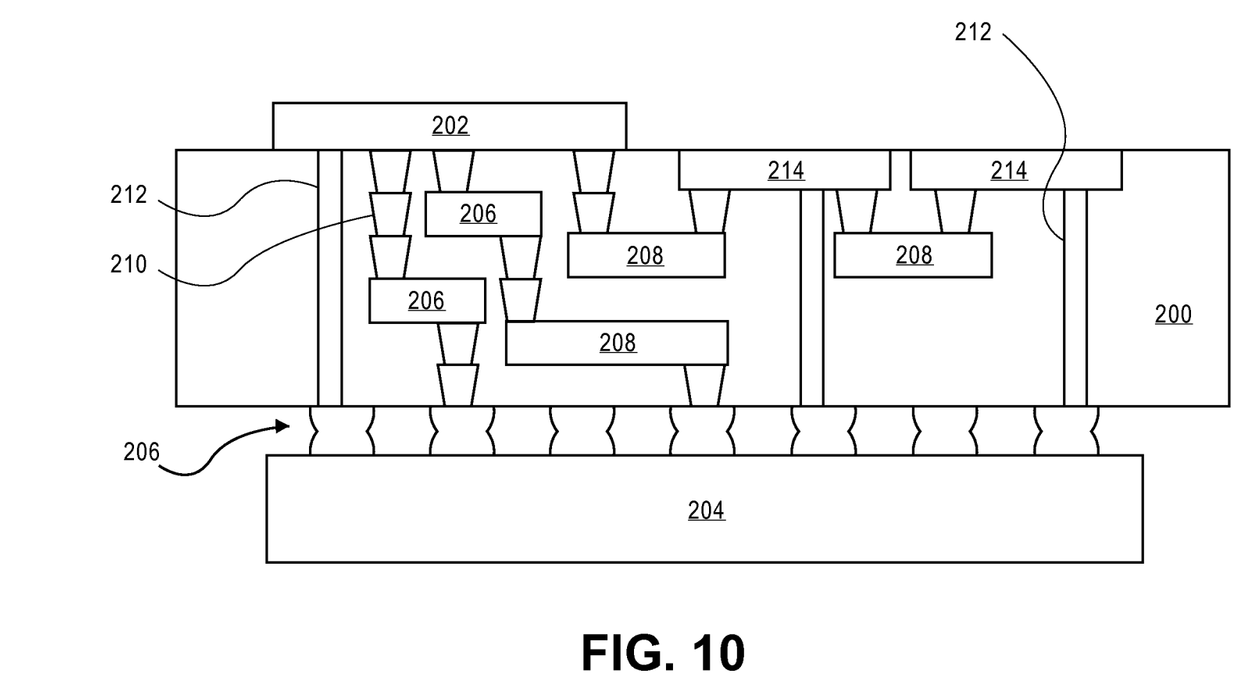
FIG. 10 is an interposer implementing one or more embodiments.

FIG. 10 illustrates an interposer 200 that includes one or more embodiments. The interposer 200 is an intervening substrate used to bridge a first substrate 202 to a second substrate 204. The first substrate 202 may be, for instance, an integrated circuit die including airgap integration between metallization layers as described above. The second substrate 204 may be, for instance, a memory module, a computer motherboard, or another integrated circuit die. Generally, the purpose of an interposer 200 is to spread a connection to a wider pitch or to reroute a connection to a different connection. For example, an interposer 200 may couple an integrated circuit die to a ball grid array (BGA) 206 that can subsequently be coupled to the second substrate 204. In some embodiments, the first and second substrates 202/204 are attached to opposing sides of the interposer 200. In other embodiments, the first and second substrates 202/204 are attached to the same side of the interposer 200. And in further embodiments, three or more substrates are interconnected by way of the interposer 200.

The interposer 200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 208 and vias 210, including but not limited to through-silicon vias (TSVs) 212. The interposer 200 may further include embedded devices 214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 200.

In accordance with embodiments, apparatuses or processes disclosed herein may be used in the fabrication of interposer 200.

Figure 11:
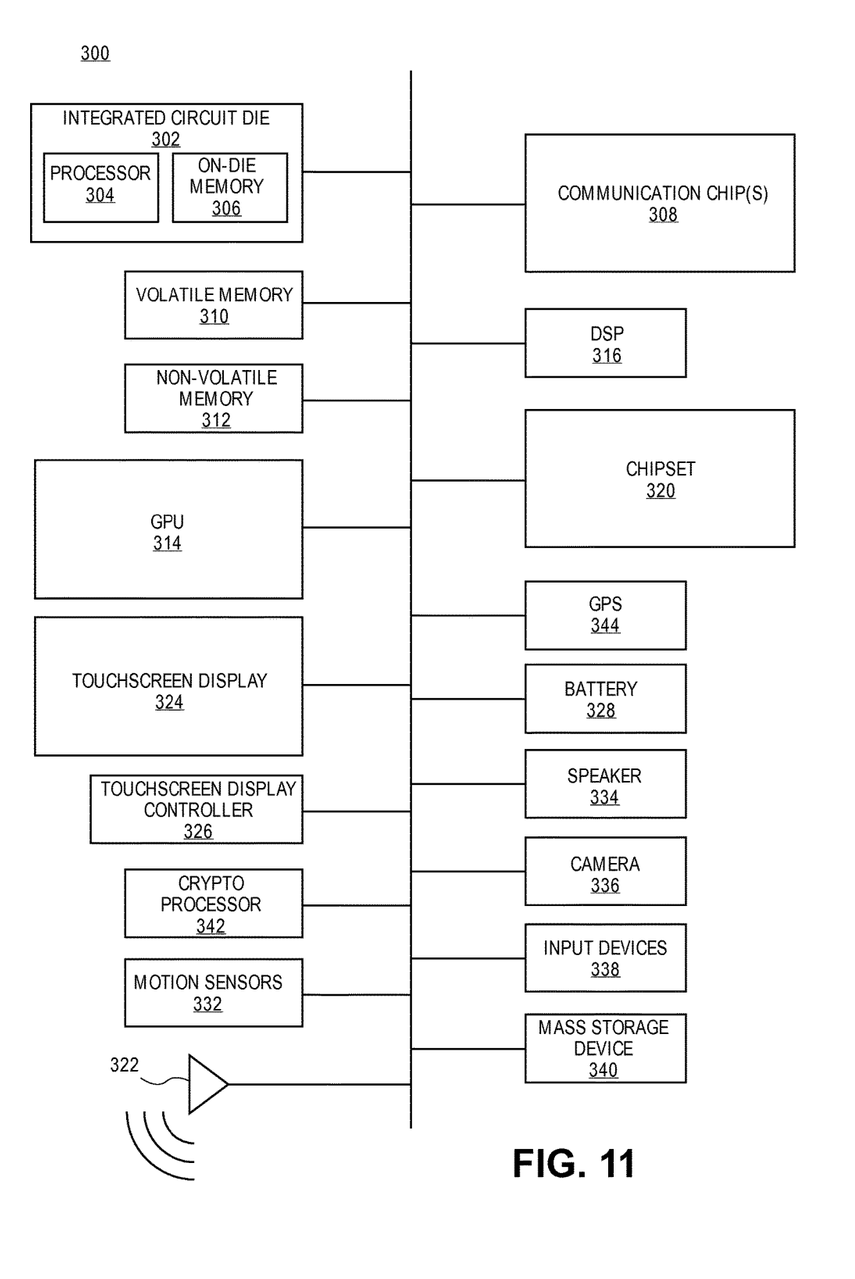
FIG. 11 illustrates an embodiment of a computing device.

FIG. 11 illustrates a computing device 300 in accordance with one embodiment. The computing device 300 may include a number of components. In one embodiment, these components are attached to one or more motherboards. In an alternate embodiment, these components are fabricated onto a single system-on-a-chip (SoC) die rather than a motherboard. The components in the computing device 300 include, but are not limited to, an integrated circuit die 302 and at least one communication chip 308. In some implementations the communication chip 308 is fabricated as part of the integrated circuit die 302. The integrated circuit die 302 may include a CPU 304 as well as on-die memory 306, often used as cache memory, that can be provided by technologies such as embedded DRAM (eDRAM) or spin-transfer torque memory (STTM or STTM-RAM).

Computing device 300 may include other components that may or may not be physically and electrically coupled to the motherboard or fabricated within an SoC die. These other components include, but are not limited to, volatile memory 310 (e.g., DRAM), non-volatile memory 312 (e.g., ROM or flash memory), a graphics processing unit 314 (GPU), a digital signal processor 316, a crypto processor 342 (a specialized processor that executes cryptographic algorithms within hardware), a chipset 320, an antenna 322, a display or a touchscreen display 324, a touchscreen controller 326, a battery 328 or other power source, a power amplifier (not shown), a global positioning system (GPS) device 344, a compass 330, a motion coprocessor or sensors 332 (that may include an accelerometer, a gyroscope, and a compass), a speaker 334, a camera 336, user input devices 338 (such as a keyboard, mouse, stylus, and touchpad), and a mass storage device 340 (such as hard disk drive, compact disk (CD), digital versatile disk (DVD), and so forth).

The communications chip 308 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 308 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 308. For instance, a first communication chip 308 may be dedicated to shorter range wireless communications such as Wi-Fi and Bluetooth and a second communication chip 308 may be dedicated to longer range wireless communications such as GPS, EDGE, GPRS, CDMA, WiMAX, LTE, Ev-DO, and others.

The processor 304 of the computing device 300 includes one or more devices, such as transistors and metallization layers and includes airgap integration between metallization layers as described above. The term "processor" may refer to any device or portion of a device that processes electronic data from registers and/or memory to transform that electronic data into other electronic data that may be stored in registers and/or memory.

The communication chip 308 may also include one or more devices, such as transistors and metallization layers and includes airgap integration between metallization layers as described above In further embodiments, another component housed within the computing device 300 may contain one or more devices, such as transistors or metallization layers and includes airgap integration between metallization layers as described above.

In various embodiments, the computing device 300 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

EXAMPLES

Example 1 is a method including forming a sacrificial material between metal lines of an integrated circuit structure; forming a mask on the sacrificial material; and after forming the mask, removing the sacrificial material to leave a void between the metal lines.

In Example 2, the mask in the method of Example 1 is a dielectric material having a porosity select to allow mass transport therethrough.

In Example 3, removing the sacrificial material in the method of Example 2 includes removing the sacrificial material through the mask.

In Example 4, prior to forming the sacrificial material, the metal lines in the method of Example 1 are disposed in a dielectric material and the method includes forming a hardmask on each of the metal lines; and removing a portion of the dielectric material.

In Example 5, the sacrificial material in the method of Example 1 is planarized to the metal lines.

In Example 6, forming a hardmask on each of the metal lines in the method of Example 4 includes forming a first hardmask material on a first metal line and a second hardmask material on a second metal line, wherein the second hardmask material is different than the first hardmask material.

In Example 7, the first metal line and the second metal line in the method of Example 6 are an initial metallization level and after removing the sacrificial material, the method comprises forming a subsequent metallization level.

In Example 8, forming the subsequent metallization level in the method of Example 7 includes forming an opening in one of the first hardmask material and the second hardmask material exclusive of the other and coupling the subsequent metallization level to the initial level metallization.

In Example 9, after removing the sacrificial material, the method of Example 1 includes forming a dielectric layer on the mask.

In Example 10, an integrated circuit structure including one or more metallization layers is made by any of the methods of Examples 1-9.

Example 11 is a method including forming a first metallization level in a dielectric layer on an integrated circuit structure, the metallization level including a plurality of metal lines; replacing a portion of the dielectric layer with a sacrificial material; forming a mask on the sacrificial material; removing the sacrificial material through the mask; and coupling a second metallization level to the first metallization level.

In Example 12, the mask in the method of Example 11 is a dielectric material having a porosity select to allow mass transport therethrough.

In Example 13, prior to replacing a portion of the dielectric layer with a sacrificial material, the method of Example 11 includes forming a hardmask on adjacent ones of the plurality of metal lines.

In Example 14, the sacrificial material in the method of Example 13 is planarized to the metallization level.

In Example 15, forming a hardmask on adjacent ones of the plurality of metal lines in the method of Example 14 includes forming a first hardmask material on a first metal line and a second hardmask material on a second metal line, wherein the second hardmask material is different than the first hardmask material.

In Example 16, forming the second metallization level in the method of Example 15 includes forming an opening in one of the first hardmask material and the second hardmask material exclusive of the other and coupling the second metallization level to the first metallization level through the opening.

In Example 17, after removing the sacrificial material, the method of Example 16 includes forming a dielectric layer on the mask and coupling a second metallization level to the first metallization level comprises forming an opening in the dielectric layer.

In Example 18, an integrated circuit structure including one or more metallization layers is made by any of the methods of Examples 11-17.

Example 19 is an apparatus including an integrated circuit substrate; a first metallization level on the substrate; a second metallization; and a mask disposed between the first metallization level and the second metallization level, the mask including a dielectric material having a porosity select to allow mass transport therethrough, wherein each of the first metallization level and the second metallization level includes a plurality of metal lines and a portion of adjacent metal lines of at least one of the first metallization level and the second metallization level are separated by voids.

In Example 20, the mask in the apparatus of Example 19 is disposed on a portion of the plurality of metal lines of the first metallization layer.

In Example 21, the mask in the apparatus of Example 20 is a first mask and the portion of the plurality of metal lines is a first portion, the apparatus further includes a different second mask on a second portion of the plurality of metal lines.

In Example 22, the second metallization in the apparatus of Example 21 is coupled to the first metallization through an opening in the second mask.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   forming a sacrificial material between metal lines of an integrated circuit structure, the metals lines having a hardmask thereon;
   forming a mask on the sacrificial material, wherein the mask is laterally adjacent to and co-planar with the hardmask on the metal lines, the mask comprising a material different than the hardmask on the metal lines; and
   after forming the mask, removing the sacrificial material to leave a void between the metal lines, wherein the mask does not include an opening between the metal lines.

2. The method of claim 1, wherein the sacrificial material is planarized to the metal lines.

3. The method of claim 1, wherein after removing the sacrificial material, the method comprises forming a dielectric layer on the mask.

4. An integrated circuit structure comprising one or more metallization layers made by the method of claim 1.

5. The method of claim 1, wherein the mask is a dielectric material having a porosity select to allow mass transport therethrough.

6. The method of claim 5, wherein removing the sacrificial material comprises removing the sacrificial material through the mask.

7. A method comprising:
   forming a hardmask on metal lines disposed in a dielectric material and removing a portion of the dielectric material, wherein forming the hardmask on the metal lines comprises forming a first hardmask material on a first metal line and a second hardmask material on a second metal line, wherein the second hardmask material is different than the first hardmask material;
   forming a sacrificial material between the metal lines;
   forming a mask on the sacrificial material; and
   after forming the mask, removing the sacrificial material to leave a void between the metal lines.

8. The method of claim 7, wherein the first metal line and the second metal line are an initial metallization level and after removing the sacrificial material, the method comprises forming a subsequent metallization level.

9. The method of claim 8, wherein forming the subsequent metallization level comprising forming an opening in one of the first hardmask material and the second hardmask material exclusive of the other and coupling the subsequent metallization level to the initial level metallization.

10. A method comprising:
    forming a first metallization level in a dielectric layer on an integrated circuit substrate, the first metallization level including a plurality of metal lines, the plurality of metals lines having a hardmask thereon;
    replacing a portion of the dielectric layer with a sacrificial material;
    forming a mask on the sacrificial material, wherein the mask is laterally adjacent to and co-planar with the hardmask on the plurality of metal lines, the mask comprising a material different than the hardmask on the plurality of metal lines;
    removing the sacrificial material through the mask, wherein the mask does not include an opening between the metal lines; and
    coupling a second metallization level to the first metallization level.

11. The method of claim 10, wherein the mask is a dielectric material having a porosity select to allow mass transport therethrough.

12. An integrated circuit structure comprising one or more metallization layers made by the method of claim 10.

13. The method of claim 10, wherein the sacrificial material is planarized to the first metallization level.

14. A method comprising:
    forming a first metallization level in a dielectric layer on an integrated circuit substrate, the first metallization level including a plurality of metal lines;

forming a hardmask on adjacent ones of the plurality of metal lines, wherein forming the hardmask on adjacent ones of the plurality of metal lines comprises forming a first hardmask material on a first metal line and a second hardmask material on a second metal line, wherein the second hardmask material is different than the first hardmask material;

replacing a portion of the dielectric layer with a sacrificial material;

forming a mask on the sacrificial material;

removing the sacrificial material through the mask; and coupling a second metallization level to the first metallization level.

15. The method of claim 14, wherein forming the second metallization level comprises forming an opening in one of the first hardmask material and the second hardmask material exclusive of the other and coupling the second metallization level to the first metallization level through the opening.

16. The method of claim 15, wherein after removing the sacrificial material, the method comprises forming a dielectric layer on the mask and coupling a second metallization level to the first metallization level comprises forming an opening in the dielectric layer.

17. An apparatus comprising:

an integrated circuit substrate;

a first metallization level on the substrate;

a second metallization level; and a mask disposed between the first metallization level and the second metallization level, the mask comprising a dielectric material having a porosity select to allow mass transport therethrough, wherein the mask is disposed on a portion of the plurality of metal lines of the first metallization level, wherein the mask is a first mask and the portion of the plurality of metal lines is a first portion, the apparatus further comprising a different second mask on a second portion of the plurality of metal lines, wherein the second metallization level is coupled to the first metallization level through an opening in the second mask, wherein each of the first metallization level and the second metallization level comprises a plurality of metal lines and a portion of adjacent metal lines of at least one of the first metallization level and the second metallization level are separated by voids.

* * * * *